HARMONIC GENERATOR WITH NON-LINEAR DEVICES OPERATING IN THE SAME MODE AT A FUNDAMENTAL FREQUENCY AND A HARMONICALLY RELATED FREQUENCY

Filed June 23, 1964 2 Sheets-Sheet 1

INVENTORS
BENSON POLIN &
OREST J. HANAS
BY Edward J. Norton
Attorney

INVENTOR.
BENSON POLIN &
OREST J. HANAS
BY
Edward J. Norton
Attorney

United States Patent Office 3,334,295

Patented Aug. 1, 1967

3,334,295

HARMONIC GENERATOR WITH NON-LINEAR DEVICES OPERATING IN THE SAME MODE AT A FUNDAMENTAL FREQUENCY AND A HARMONICALLY RELATED FREQUENCY

Benson Polin and Orest J. Hanas, Philadelphia, Pa., assignors to Radio Corporation of America, a corporation of Delaware Filed June 23, 1964, Ser. No. 377,341
9 Claims. (Cl. 321—69)

This invention relates to harmonic generators, and, particularly, to an improved high efficiency harmonic generator capable of handling high power at microwave frequencies.

Variable capacitance semiconductor junction diodes are one form of voltage variable non-linear reactance device commonly used in the construction of harmonic generators. Such variable capacitance, high Q diodes perform adequately at low power and at frequencies below 1 kmc. (kilomegacycles), for example. Considerable difficulties are encountered, however, when an attempt is made to use the available variable capacitance diodes at high power and at microwave frequencies above 1 kmc. Since the breakdown voltage of the diodes is low, large voltage swings can not be accommodated. Also, there is a definite limit on the power dissipation of the diodes, particularly where use is made of the small pill-type or prong-type diodes designed for high frequency applications.

It would seem that the above difficulties encountered in high frequency, microwave applications can be minimized by stacking the variable capacitance diodes one directly on top of another, thus increasing the voltage breakdown value and the power dissipation of the combination additively. The Q of the diodes in series is unaltered. However, stacking the variable capacitance diodes does not provide a harmonic generator of high efficiency. The diodes represent in their physical dimensions a significant portion of a wavelength at microwave frequencies. As a result, the junctions of the stacked diodes are not positionable at optimum electrical positions for operation in resopnse to applied signal energy. Further, the physical contact between the diodes is a poor heat sink.

It is an object of the invention to provide an improved harmonic generator.

Another object is to provide an improved harmonic generator capable of handling high power with high efficiency at microwave frequencies.

A further object is to provide an improved harmonic generator for operation at microwave frequencies by cascading voltage variable non-linear reactance devices.

A still further object is to provide an improved variable capacitance semiconductor junction diode harmonic generator for high power operation at microwave frequencies.

Briefly, in one embodiment of the invention described herein, microwave techniques are used to construct an assembly for applying signal energy of a fundamental frequency to and for deriving signal energy of a desired multiple or harmonic frequency from a pair of variable capacitance semiconductor junction diodes. The diodes are spaced at a given distance from one another by means of a rod or other suitable structure so as to place both diodes substantially at optimum electrical points of the electric (E)-magnetic (H) field distribution. The spacer rod acts as an idling tank circuit tuned to an appropriate frequency determined by the output harmonic frequency. The two diodes are, in effect, separately driven, resulting in the combination of the two diodes handling a considerably greater amount of power than can be handled by a single diode. At the same time, the use of the double diode configuration results in little or no loss of efficiency over that achieved in single diode configuration. Where greater power handling capability is desired, more than two diodes can be used with each additional diode spaced by a spacer rod from the previous diode at the above-mentioned given distance.

A more detailed description of the invention will now be given in connection with the attached drawing, in which.

Figures 1, 2:
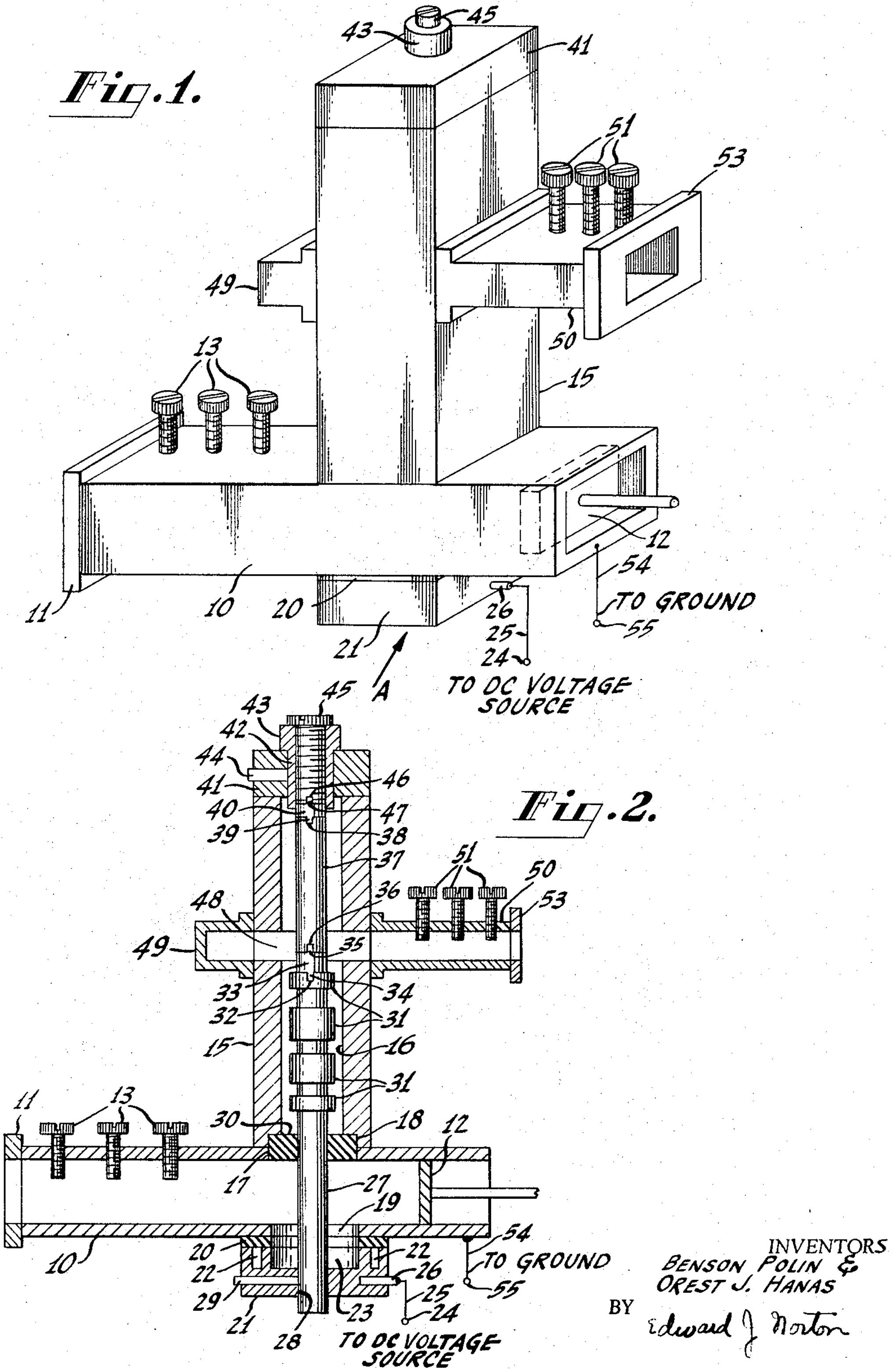
FIG. 1 is a perspective view of one embodiment of a harmonic generator constructed according to the invention.
FIG. 2 is a view partly in section looking in the general direction of the arrow A in FIG. 1.

The microwave harmonic generator shown in FIGS. 1 and 2, which is not drawn to scale, comprises a metallic, rectangular waveguide section 10. The dimensions of the wave guide 10 are determined according to the operating frequencies of interest and in the example of a typical operation of the harmonic generator to be described are assumed to be those of an X-band waveguide. One end of the waveguide 10 is terminated at a flange 11. A tuning means in the form of a movable plunger or short circuit 12 is located at the other end of the waveguide 10. Tuning screws 13 are positioned on a broad wall of the waveguide 10. The screws 13 are used in the customary manner to match the impedance of the waveguide 10 to that of the following circuitry. Any suitable impedance matching device, for example, an E–H tuner, can be used in place of the screws 13.

A block-like member 15 constructed of aluminum or other suitable metallic material is mounted by means of bolts or other mechanical connecting means, not shown, on a broad wall of the waveguide 10. As shown in the view of FIG. 2, the member 15 is bored to provide a round hole 16 extending through the center and along the length of the member 15. The member 15 is positioned on the waveguide 10 so that the hole 16 lines up with a round hole 17 provided in the broad wall of the waveguide 10. A portion of the hole 16 in the member 15 is matched to the diameter of the hole 17 in the waveguide 10. Hole 17 is dimensioned to provide a quarter-wave transformer 18 at the junction of the member 15 and the waveguide 10. A round hole 19 is placed in the broad wall of the waveguide 10 opposite the location of the hole 17. A thin, flat dielectric ring 20 constructed of mica or other low loss dielectric material is positioned exterior of the waveguide 10 and around the hole 19.

A second block-like member 21 constructed of aluminum or other suitable material is mounted by suitable mechanical connecting means, not shown, on the dielectric ring 20 so that the second member 21 is isolated from the waveguide 10 for direct current by the dielectric ring 20. An annular slot 22 is cut in the second member 21 to provide a short circuit for radio frequency signal energy between the waveguide 10 and the second member 21 across the dielectric ring 20. The second block-like member 21 is drilled to provide a round hole or well 23 having the same diameter as the hole 19 in the waveguide 10 and a depth determined for optimum matching at input frequency. As indicated in FIG. 2, the hole 19 in the waveguide 10, the ring 20 and the second member 21 are aligned so that a smooth sided, round opening exists through the waveguide 10 and into the second member 21. A source of unidirectional potential, not shown is connected to the second member 21 over a path including a terminal 24, a connecting lead 25 and a set screw or other electrical contact 26 on the second member 21. A ground connection is provided from the waveguide 10 to a suitable terminal 55 via a connecting lead 54.

A round rod 27 constructed of aluminum or other metallic current conducting material is positioned so that one end extends through the opening 17 in the waveguide 10 and into the hole 16 bored through the first block-like member 15. The other end of the rod 27 extends through the opening provided by the hole 19 in the waveguide 10, the dielectric ring 20 and the well 23 in the second block-like member 21. The rod 27 is shown as passing through a hole 28 provided in the second block-like member 21. A set screw 29 serves to lock the rod 27 in position. While the rod 27 is shown as passing entirely through the second block-like member 21, the second block-like member 21 can instead be provided with a suitable seat, not shown, for holding one end of the rod 27 substantially in the center of the well 23.

An annular ring 30 made of polytetrafluoroethylene identified as Teflon or other material of dielectric quality is positioned in the recess formed by the quarter-wave transformer 18 and surrounds the rod 27. The ring 30 serves to centrally locate and hold the rod 27 in the hole 16 bored through the first block-like member 15. That portion of the rod 27 located within the hole 16 is constructed in the form of a coaxial low pass filter. The filter is provided by the center conductor or rod 27 surrounded by concentric tubular ring-like elements 31, providing the necessary impedance changes for effecting the filtering action. The number of elements 31 employed and the dimensions thereof are determined following known techniques according to the cut-off characteristic desired for the filter at the operating frequencies of interest. As is understood in the construction of such filter arrangements, the elements 31 at the respective ends of the filter are made one-half the width of the other elements 31 regardless of the total number of elements 31 used in a given application.

The end element 31 shown in FIG. 2 as terninating the rod 27 is provided with a small hole 32. A prong-type variable capacitance diode 33 is mounted on the element 31 at the end of the rod 27 by inserting a suitable electrical contact in the shape of a projection 34 on the housing of the diode 33 into the hole 32. The opposite side of the housing of the diode 33 also includes a second electrical contact in the shape of a projection 35. A second round rod 37 preferably constructed of cold rolled steel for temperature compensation or of other suitable material has a small hole 36 at one end into which the projection 35 on the housing of the diode 33 is inserted, locking the diode 33 between the two rods 37 and 27.

The other end of the rod 37 has a small hole 38 into which an electrical contact in the shape of a projection 39 on the housing of a second variable capacitance diode 40 is inserted. A top plate 41 is mounted at the end of the first block-like member 15 by any suitable mechanical connecting means, not shown. The top plate 41 can be constructed of the same metallic material as the member 15 or of other suitable material. A hole 42 is drilled through the plate 41 in a line with the location of the rod 37 and the variable capacitance diode 40 in the hole 16 bored through the first block-like member 15. A metal housing 43 having a smooth outer surface and a threaded internal bore is inserted into the hole 42 and through the plate 41. The housing 43 has a raised portion at one end of a diameter larger than that of the hole 42 in the plate 41 so that the housing 43 removably sits in the hole 42. A set screw 44 is shown for locking the housing 43 in position. A bolt 45 is threaded into the housing 43. The end of the bolt 45 has a small hole 46. As the bolt 45 is threaded into the housing 43, a second electrical contact in the form of a projection 47 on the second variable capacitance diode 40 is inserted into the hole 46 in the end of the bolt 45. The action of the bolt 45 serves to hold the two variable capacitance diodes 33, 40 and the two rods 37, 27 in assembled relationship. The rod 37 acts as a heat sink for both variable capacitance diodes 33 and 40.

A portion of the first block-like member 15 in the vicinity of the first variable capacitance diode 33 is cut out to form a second rectangular waveguide section 48 extending from one side of the member 15 to the opposite side thereof in a line perpendicular to and through the center axis of the hole 16 bored through the first block-like member 15. The waveguide section 48 is placed relative to the position of the first variable capacitance diode 33 so that approximately one-half of the first variable capacitance diode 33 is supported within the waveguide section 48. A waveguide cavity 49 is mounted by suitable mechanical connecting means such as bolts or other similar structure, not shown, on one side of the first block-like member 15 in a manner to properly terminate the waveguide section 48 while providing the proper coaxial-to-waveguide transition. A third waveguide section 50 is mounted by suitable mechanical connecting means, not shown, on the opposite side of the first block-like member 15 in alignment with the cavity 49 and waveguide section 48. The third waveguide section 50 provides an output path for signal energy of a desired freqency appearing in the waveguide section 48. Tuning screws 51 are mounted on the third waveguide section 50 for matching the impedance of the third waveguide section 50 to that of circuitry, not shown, connected thereto via a flange 53. While the dimensions of the cavity 49 and of the second and third waveguide sections 48, 50 will be determined according to the needs of a particular application, the dimensions are assumed in the example to be described to be those of a Ka-band waveguide. As in the case of screws 13, any suitable impedance matching device can be used in place of the screws 51.

A typical operation of the embodiment shown in FIGS. 1 and 2 as a tripler harmonic generator will now be described. Reference will be made only by way of example to the signal frequencies and circuit parameters actually employed in a tripler harmonic generator constructed in the manner of that shown in FIGS. 1 and 2. It will be assumed that it is desired to efficiently generate the third harmonic of 30 kmc. (kilomegacycles) from a high powered input signal having a frequency of 10 kmc. An input signal having a frequency of 10 kmc. and a power of 400 milliwatts, for example, is fed into the waveguide 10 from suitable circuitry, not shown, mechanically connected to the waveguide 10 by the flange 11. The radio frequency signal energy travels along the waveguide 10 to the waveguide-to-coax transition in the area of the rod 27. The plunger 12 is adjusted to match the impedance, for example, 600 ohms, of the waveguide 10 to that of the waveguide-to-coax transition, for example, 50 ohms. The plunger 12 is adjusted so that when considered with the depth of the well 23, the proper impedance matching for broad bandedness between the waveguide 10 and the input to the coaxial low pass filter results. The spacing between the plunger 12 and the rod 27 will be approximately one-quarter wavelength at the input frequency or 10 kmc. for this condition.

The radio frequency signal energy propagates along the coaxial transmission line including the rod 27 as the inner conductor and the wall of the hole 16 as the outer conductor. The quarter-wave transformer 18 serves to match the impedance of the waveguide-to-coax transition given by way of example above as 50 ohms to that of the low pass filter including the elements 31 in the range of 20 to 30 ohms, for example. The diameter of the hole 16 and the dimensions of the rod 27 and of the elements 31 are determined to provide a low pass filter having a cut-off characteristic above the fundamental frequency or 10 kmc. but below the second harmonic or 20 kmc. The low pass filter can have a cut-off frequency of 15 kmc., for example. The low pass filter formed by the rod 27 and the elements 31 passes the fundamental frequency to the first and second variable capacitance diodes 33, 40 but prevents the passage of harmonics thereof back to the waveguide 10.

The variable capacitance diodes 33 and 40 are PN junction diodes which exhibit a non-linear capacitance variation with applied bias voltage. When the diodes 33 and 40 are operated in the capacitance mode for generating harmonics, the efficiency is determined by the value of the series resistance of the diodes 33, 40. The lower the value of the series resistance, the more efficient the diodes 33, 40 become. The capacitive mode occurs when the diodes 33, 40 are back biased between the avalanche and forward breakdown voltages. If the applied voltage swings over into either region where the current is caused to flow, the efficiency will drop since part of the power applied is converted into dissipative $I^2R$-loss power rather than into harmonic power. The diodes 33, 40 are retained in a non-conducting, reverse biased condition by the application of a suitable direct current voltage to the terminal 24 and over the path including the second block-like member 21, rod 27, the first variable capacitance diode 33, rod 37, the second variable capacitance diode 40, top plat 41, the first block-like member 15, waveguide 10, lead 54 and terminal 55. The two diodes 33, 40 are preferably poled in the same direction determined by the polarity of the bias voltage. Assuming that a bias voltage of +10 volts is applied to the terminal 24, the cathode of the first variable capacitance diode 33 is connected by contact 34 to the low passfilter element 31 on the rod 27 with the anode of the first diode 33 connected by the contact 35 to the rod 37. The cathode of the second variable capacitance diode 40 is connected by the contact 39 to the rod 37 with the anode of the second diode 40 connected to the bolt 45 by the contact 47. Should a reverse or negative polarity bias voltage be used, the diodes 33 and 40 are poled in the opposite direction.

Any suitable type or construction of the two variable capacitance diodes 33 and 40 may be used. However, an example of a diode successfully used for the two variable capacitance diodes 33, 40 are gallium arsenide junction diodes characterized by a 17 volt breakdown voltage; .5 picafarad junction capacitance at zero volts; and 170 kmc. cut off frequency at −6 volts. The diodes were packaged to provide a low capacity package of approximately .16 picafarad.

In order to provide a tripler harmonic generator, the two variable capacitance diodes 33, 40 are spaced apart by the rod 37 a distance equal to one-half wavelength at the second harmonic frequency of 20 kmc. For the particular diodes mentioned above, this distance was approximately .285 inch. The diameter of the rod 37 is determined with respect to that of the hole or cavity 16 to provide the proper impedance matching for the two diodes 33, 40 at the operating frequencies of interest or in the present example 10 kmc. and the harmonics thereof. The two variable capacitance diodes are driven in their non-linear capacitive reactance condition by the received radio frequency signal at the fundamental frequency of 10 kmc.

Figure 3:
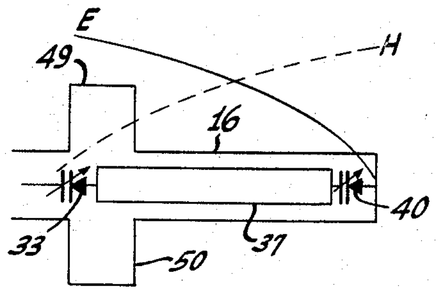
FIGS. 3, 4 and 5 are field distribution patterns useful in describing a typical operation of the embodiment shown in FIG. 1.
Figure 4:
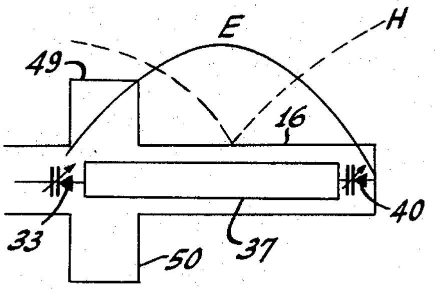
Figure 5:
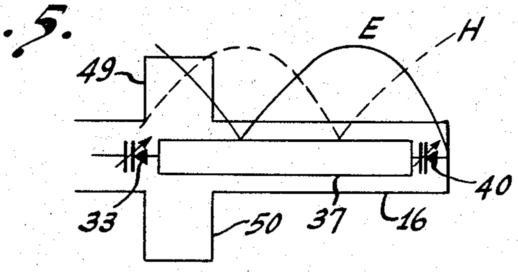

The assembly including the two variable capacitance diodes 33 and 40, the rod 37 and the hole 16 comprises a coaxial line shorted at one end by the top plate 41 and associated structure. The second variable capacitance diode 40 is located at the shorted end of the coaxial spacing line which automatically places the diode 40 in the maximum magnetic field (H) concentration and therefore at a maximum current point along the coaxial line. FIGS. 3, 4, 5 represent the field distribution for the fundamental frequency, second harmonic frequency, and third harmonic frequency, respectively. The magnetic field is indicated by a dashed line H and the electric field is indicated by a solid line E. As shown in FIG. 3, the two variable capacitance diodes 33, 40 are spaced one-quarter wavelength apart at the fundamental frequency or 10 kmc. The second variable capacitance diode 40 being located at the maximum current point is operated in a current pumped equivalent circuit or shunt mode. The first variable capacitance diode 33 is located at the maximum electric field (E) and is operated in a voltage pumped equivalent circuit or series mode. Recalling that the rod 37 spaces the two variable capacitance diodes 33, 40 one-half wavelength at the second harmonic frequency or 20 kmc., the field distribution at the second harmonic frequency is as shown in FIG. 4. The second variable capacitance diode 40 is operated in a current pumped equivalent circuit or shunt mode. The first variable capacitance diode 33 is located for the second harmonic at the maximum magnetic field (H) and is also operated in a current pumped equivalent circuit or shunt mode.

In the case of the third harmonic frequency or 30 kmc. as shown in FIG. 5, the second variable capacitance diode 40 is operated in a current pumped equivalent circuit or shunt mode. The first variable capacitance diode 33 is positioned at the maximum electric field (E) and, therefore, is operated in a voltage pumped equivalent circuit or series mode. Since the transfer of energy is to be from the fundamental frequency to the third harmonic frequency, the operating modes for the two variable capacitance diodes 33 and 40 should for maximum efficiency be the same at the fundamental and third harmonic frequencies. As shown in FIGS. 3 and 5 and described above, this is the case.

The dimensions of the output waveguide arrangement including the waveguide cavity 49, the second waveguide section 48 and the third waveguide section 50 are determined so that only signal energy of the third harmonic frequency is supported. The output waveguide arrangement can have a cut-off frequency of 21 kmc., for example. The output waveguide arrangement 48, 49 and 50 acts as a common load at the third harmonic frequency or 30 kmc. for both the variable capacitance diodes 33 and 40. As pointed out above in connection with FIG. 4, the first variable capacitance diode 33 does operate in a current pumped or shunt mode at the second harmonic. Since the second harmonic frequency is not supported by the output waveguide 50, there is effectively no output load at this frequency. The operation of the first variable capacitance diode 33 in the current pumped or shunt mode results in little dissipation of energy at the second harmonic frequency but does serve to distribute current at the second harmonic (idle) frequency along the coaxial line structure.

The spacing rod 37 having a length equal to one-half wavelength at the second harmonic frequency is a resonant tank circuit for the second harmonic current. With the low pass filter having a cut-off frequency of 15 kmc. on one end and the Ka-band output waveguide arrangement 48, 49 50 having a cut-off frequency of 21 kmc. on the other end, the second harmonic frequency signal energy is captive along the coaxial line formed by the rod 37 and the hole or cavity 16. A tuned tank circuit at idling frequency is provided with the second harmonic frequency signal energy being circulated but not dissipated across a real load. Because of its cut-off frequency, the output waveguide arrangement 48, 49, 50 operates as a load only for signal energy at the third harmonic frequency and does not present a load to either the energy at the second harmonic frequency or at the fundamental frequency. Since the power of the input frequency signal is largely transferred to the desired, third harmonic frequency rather than to other harmonic frequencies, a high efficiency harmonic generator is provided. Based on the circuit parameters given above by way of example, the harmonic generator was found to provide an output having a frequency of 30 kmc. and power of 80 milliwatts in response to the input of a 10 kmc. frequency and power of 400 milliwatts.

A high power harmonic generator is provided. The input power divides between the two variable capacitance diodes 33, 40 greatly increasing the amount of input power possible over that handled by a single diode configuration. While the input power is not believed to divide equally between the two variable capacitance diodes 33 and 40, the input power does divide in proportions related to the capacitance values of the diodes and permitting a considerably higher power input level than previously obtainable in the operation of harmonic generators. In addition to providing a higher power capability, the harmonic generator described also provides high efficiency. The construction of the harmonic generator serves to place both of the variable capacitance diodes at optimum electrical points of the E–H field distribution. By driving both diodes 33, 40 in maximum fields (one in a series mode and one in a shunt mode) with a common output load at the third hramonic frequency, maximum transfer of energy from the fundamental to the desired harmonic frequency takes place. The efficiency obtained corresponds to that obtained in a single diode configuration.

Where greater power handling capability is desired for the operation of harmonic generator at a given input frequency, more than two variable capacitance diodes can be used. Each additional diode is cascaded with the two diodes 33 and 40 in the manner shown in FIG. 2 for the two diodes. Each added diode is spaced by a rod or similar structure from the preceding diode by a distance substantially equal to that separating the two diodes 33 and 40, resulting in all the diodes being located at optimum electrical points of the E–H field distribution.

A particular type of construction has been shown for the variable capacitance diodes 33 and 40 in FIG. 2 involving the provision of projections for mounting the diodes. In practice, the variable capacitance diodes 33 and 40 may be of the prong-type, the pill-type or some form of cartridge-type. Any suitable technique may be used for mounting the two variable capacitance diodes 33 and 40 with the two rods 27 and 37. Where pill-type diodes are used, for example, the two variable capacitance diodes 33 and 40 can be simply held by frictional contact in aligned relationship with the rods 27 and 37. Reference has also been made to the use of variable capacitance diodes having a low capacity package in connection with a specific spacing between the two diodes 33 and 40 cited by way of example. Where variable capacitance diodes having a higher capacitance package are used, the length of the rod 37 is increased a corresponding amount to compensate for the added capacitance and provide the proper location of the two variable capacitance diodes at the optimum electrical points of the E–H field distribution.

The rod 37 spacing the two variable capacitance diodes 33 and 40 is shown in FIG. 2 as being of a uniform diameter. Where greater bandwidth of the device is desired, the diameter of the rod 37 in the region of the coax-to-waveguide transition can be increased, making the transition less severe. The end of the rod 37 next to the first variable capacitance diode 33 can be machined to provide a gradual taper away from the diode 33 or a ring can be raised around the end of the rod 37. The actual construction can be determined according to the impedance matching requirements of a particular application.

While described as a tripler or third harmonic generator, the harmonic generator provided by the invention can be operated to generate other harmonic frequencies. For example, either the second or fourth harmonic frequency can be produced with the arrangement of FIGS. 1 and 2 by changing the dimensions of the output waveguide arrangement 48, 49 and 50 to support and pass the harmonic frequency of interest. The operation otherwise follows from that described above.

Where a more efficient operation is desired at the second or fourth harmonics, the spacing between the two variable capacitance diodes 33 and 40 is made equal to one-half wavelength at the fundamental or input frequency. In the case of the second harmonic generation, the dimensions of the output waveguide arrangement 48, 49 and 50 are determined so as to support the second harmonic frequency. The two variable capacitance diodes 33 and 40 are both in a current pumped equivalent circuit or shunt mode at the fundamental frequency and are both in a current pumped equivalent circuit or shunt mode at the second harmonic frequency. Since the diodes 33 and 40 are in the same mode at both fundamental and the desired harmonic frequency, maximum transfer of energy takes place therebetween. In generating the fourth harmonic, the output waveguide arrangement 48, 49, 50 is dimensioned to support and pass the fourth harmonic and the two variable capacitance diodes 33 and 40 are spaced at one-half the wavelength of the fundamental frequency. Again, both diodes are in a current pumped equivalent circuit or shunt mode at the fundamental frequency and at the fourth harmonic frequency. Efficient, high power operation of the harmonic generator at the fourth harmonic frequency results.

What is claimed is:

1. A harmonic generator comprising, in combination,
a plurality of variable capacitance diodes,
means cascading said diodes with said diodes positioned in series at similar optimum electrical points of the electromagnetic field distribution patterns for signal energy of a first frequency and of a further frequency harmonically related to said first frequency,
a low pass filter having a cut-off frequency above said first frequency but below the second harmonic frequency of said first frequency,
means for applying a signal of said first frequency through said filter to said diodes so as to operate said diodes in the their capacitive reactance condition in response to said signal of said first frequency,
and output means having a cut-off frequency below said further frequency for deriving a second signal of said further frequency from said diodes.

2. In, combination,
a first and a second voltage variable non-linear reactance device,
means forming a coaxial line section including said first and second devices spaced from one another as a part of the inner conductor of said line in a manner to place said devices at optimum electrical points of the electromagnetic field distribution pattern on said line of a signal of a first frequency and of a further frequency harmonically related thereto,
means for short circuiting one end of said line in the vicinity of one of said devices so as to place said one device in a maximum current point of said pattern,
means for applying a signal of said first frequency to the other end of said line,
and means coupled to said line for deriving a second signal having a frequency harmonically related to said first frequency from said line.

3. In combination,
a plurality of voltage variable non-linear reactance devices,
means forming a coaxial line section including said devices spaced from one another as a part of the inner conductor of said line so as to place said devices at optimum electrical points of the electromagnetic field distribution pattern on said line of a signal of a first frequency and of a further frequency harmonically related thereto, means for short circuiting one end of said line in the vicinity of one of said devices so as to place said one device in a maximum current point of said pattern, a coaxial low pass filter having a cut-off frequency above said first frequency but below the second harmonic of said first frequency, means for applying a signal of said first frequency through said filter and to the other end of said line, and means coupled to said line for deriving from said line a second signal having a frequency harmonically related to said first frequency.

4. In combination, first and second voltage variable non-linear reactance devices, means forming a coaxial line section including said devices spaced from one another as a part of the inner conductor of said line so as to place said devices at optimum electrical points of the electromagnetic field distribution pattern on said line of a signal of a first frequency and a further frequency harmonically related thereto, means for short circuiting one end of said line in the vicinity of one of said devices so as to place said one device at a maximum current point of said pattern, a coaxial low pass filter coupled at one end to the other end of said coaxial line and having a cut-off frequency above said first frequency but below the second harmonic of said first frequency, a waveguide, means including a waveguide-to-coax transition for applying a first signal of said first frequency from said waveguide through said filter to said coaxial line, a second waveguide, and means including a coax-to-waveguide transition for deriving a second signal of a frequency harmonically related to said first frequency from said coaxial line and for applying said second signal into said second waveguide.

5. A tripler harmonic generator comprising, in combination, first and second variable capacitance semiconductor junction diodes, means forming a coaxial line section including said diodes spaced from one another as a part of the inner conductor of said line so as to place said diodes at a distance apart equal to one-half wavelength at the second harmonic of a fundamental frequency, means for short circuiting one end of said line in the vicinity of one of said diodes so as to place said one diode at a maximum current point in the field distribution pattern of a signal of said second harmonic frequency propagated along said line, a coaxial low pass filter coupled at one end to the other end of said coaxial line and having a cut-off frequency above said fundamental frequency but below said second harmonic frequency, means coupled to the other end of said filter for applying a signal of said fundamental frequency through said filter to said coaxial line, and means coupled to said other end of said coaxial line for deriving from said coaxial line a second signal having a frequency equal to the third harmonic of said fundamental frequency.

6. A tripler harmonic generator comprising, in combination, first and second variable capacitance semiconductor junction diodes, means forming a coaxial line section including said diodes spaced from one another as a part of the inner conductor of said line so as to place said diodes at a distance apart equal to one-half wavelength at the second harmonic of a fundamental frequency, means for short circuiting one end of said line in the vicinity of one of said diodes so as to place said one diode at a maximum current point in the field distribution pattern of a signal of said second harmonic frequency propagated along said line, a coaxial low pass filter coupled at one end to the other end of said coaxial line and having a cut-off frequency above said fundamental frequency but below said second harmonic frequency, a waveguide, means including a waveguide-to-coax transition for applying a first signal of said fundamental frequency from said waveguide through said filter to said coaxial line, a second waveguide, and means including a coax-to-waveguide transition for deriving a second signal having a frequency equal to the third harmonic of said fundamental from said coaxial line and for applying said second signal into said second waveguide.

7. A tripler harmonic generator comprising, in combination, a first waveguide dimensioned to support a first signal of fundamental frequency, a coaxial low pass filter including inner and outer conductors and having a cut-off frequency above said fundamental frequency but below the second harmonic of said fundamental frequency, a first variable capacitance semiconductor junction diode mounted on the end of said inner conductor removed from said waveguide, a rod of metallic, current-conducting material, a second variable capacitance semiconductor junction diode spaced from said first diode by said rod a distance substantially equal to one-half wavelength at said second harmonic and substantially equal to three fourths wavelength at the third harmonic of said fundamental frequency so that said rod and said diodes form a continuation of said inner conductor, said outer conductor of said filter forming with said diodes and said rod a coaxial line section, a waveguide-to-coax transition for coupling said first signal from said waveguide and through said filter to said coaxial line section, means for connecting the free end of said second diode to said outer conductor to short circuit the end of said coaxial line section and place said second diode at a maximum current point in the electromagnetic field distribution pattern of said first signal on said coaxial line, means to apply a direct current voltage to said inner conductor and said rod to cause said diodes to operate in their capacitive reactance condition in response to said first signal, a second waveguide dimensioned to support a second signal of a frequency equal to the third harmonic of said fundamental frequency but not to support said fundamental frequency or the second harmonic thereof, and a coax-to-waveguide transition located in the vincinity of said first diode for deriving said second signal from said coaxial line section for applying said second signal into said second waveguide.

8. A harmonic generator comprising, in combination (a) a plurality of voltage variable nonlinear reactance devices, (b) means for cascading said devices in a series path with said devices spaced one from another at substantially optimum electrical points of the electromagnetic field distribution at a first frequency and at an harmonically related frequency thereof to cause said devices to operate in the same mode at said first and said harmonically related frequency, (c) and means for applying a signal of said first frequency to said devices and for deriving a second signal at said harmonically related frequency from said devices.

9. A tripler harmonic generator comprising, in combination, (a) first and second voltage variable non-linear reactance devices, (b) means for cascading said devices with said devices being spaced from one another at a distance substantially equal to one-half wavelength at the second harmonic frequency of a given fundamental frequency and substantially equal to three-fourths wavelength at the third harmonic of said fundamental frequency, (c) means for applying a signal of said fundamental frequency to said devices so as to operate said devices in their non-linear condition in response to said signal, (d) and means for deriving a second signal of a frequency equal to the third harmonic frequency of said fundamental frequency from said devices.

References Cited

UNITED STATES PATENTS

| | | | |
|---|---|---|---|
| 2,408,420 | 10/1946 | Ginzton | 321—60 X |
| 2,460,109 | 1/1949 | Southworth | 321—60 X |
| 3,060,365 | 10/1962 | Crandell | 321—69 |
| 3,175,164 | 3/1965 | Schreiner | 330—4.9 |
| 3,263,154 | 7/1966 | Steele | 321—69 |
| 3,268,795 | 8/1966 | Hudspeth et al. | 321—69 |

JOHN F. COUCH, *Primary Examiner.*

G. GOLDBERG, *Assistant Examiner.*

UNITED STATES PATENT OFFICE
CERTIFICATE OF CORRECTION

Patent No. 3,334,295 August 1, 1967

Benson Polin et al.

It is hereby certified that error appears in the above numbered patent requiring correction and that the said Letters Patent should read as corrected below.

Column 5, line 51, for "of" read -- or --; column 9, lines 49 and 75, after "frequency", each occurrence, strike out the comma and insert instead -- and substantially equal to three-fourths wavelength at the third harmonic of said fundamental frequency, --.

Signed and sealed this 24th day of September 1968.

(SEAL)
Attest:

Edward M. Fletcher, Jr.
Attesting Officer

EDWARD J. BRENNER
Commissioner of Patents